United States Patent
Ho et al.

(10) Patent No.: US 6,548,413 B1
(45) Date of Patent: *Apr. 15, 2003

(54) METHOD TO REDUCE MICROLOADING IN METAL ETCHING

(75) Inventors: Paul Kwok Keung Ho, Singapore (SG); Thomas Schulue, Singapore (SG); Raymond Joy, Singapore (SG); Wai Lok Lee, Singapore (SG); Ramasamy Chockalingam, Singapore (SG); Ba Tuan Pham, Singapore (SG); Premachandran Vayalakkara, Singapore (SG)

(73) Assignee: Chartered Semiconductor Manufacturing Ltd., Singapore (SG)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 585 days.

(21) Appl. No.: 09/048,208

(22) Filed: Mar. 26, 1998

(51) Int. Cl.[7] .................... H01L 21/302; H01L 21/3065
(52) U.S. Cl. .................... 438/706; 438/738; 438/742
(58) Field of Search .................... 438/738, 742, 438/706

(56) References Cited

U.S. PATENT DOCUMENTS

| | | | |
|---|---|---|---|
| 5,545,289 A | 8/1996 | Chen et al. | 156/643.1 |
| 5,556,501 A | 9/1996 | Collins et al. | 156/345 |
| 5,582,679 A | 12/1996 | Lianjun et al. | 156/651.1 |
| 5,772,906 A | * 6/1998 | Abraham et al. | 216/72 |
| 5,827,437 A | * 10/1998 | Yang et al. | 216/77 |
| 5,846,443 A | * 12/1998 | Abraham et al. | 216/77 |
| 5,883,007 A | * 3/1999 | Abraham et al. | 438/714 |

* cited by examiner

Primary Examiner—Benjamin L. Utech
Assistant Examiner—Lynette T. Umez-Eronini
(74) Attorney, Agent, or Firm—George O. Saile; Rosemary L.S. Pike

(57) ABSTRACT

A new method of etching metal lines with reduced microloading effect is described. Semiconductor device structures are provided in and on a semiconductor substrate and covered with an insulating layer. A barrier metal layer is deposited overlying the insulating layer and a metal layer is deposited overlying the barrier metal layer. The metal layer is covered with a photoresist mask wherein there are both wide spaces and narrow spaces between portions of the photoresist mask. The metal layer is etched away where it is not covered by the photoresist mask wherein the barrier metal layer is reached within the wide spaces while some of the metal layer remains within the narrow spaces. The metal layer remaining within the narrow spaces is selectively etched away. Thereafter, the barrier metal layer not covered by the photoresist mask is etched away wherein the insulating layer is reached within the wide spaces while some of the barrier metal layer remains within the narrow spaces. The barrier metal layer remaining within the narrow spaces is selectively etched away. Thereafter, the insulating layer not covered by the photoresist mask is overetched to complete the metal lines without microloading in the fabrication of an integrated circuit.

20 Claims, 3 Drawing Sheets

METHOD TO REDUCE MICROLOADING IN METAL ETCHING

BACKGROUND OF THE INVENTION (1) Field of the Invention

The invention relates to a method of etching metal lines, and more particularly, to a method of etching metal lines with reduced microloading in the manufacture of integrated circuits.

(2) Description of the Prior Art

In the formation of metal lines, a barrier metal layer is deposited over an oxide layer followed by a metal layer, such as aluminum. The aluminum layer is etched where it is not covered by a mask. Next, the barrier layer is etched, and finally an oxide etch or overetch is performed. In the current practice, the problem of microloading is severe. That is, narrow spaces are etched to a smaller depth than are wider spaces. In deep sub-micron technology, where the design rule shrinks the line spacing, the microloading effect is further-aggravated. Microloading can cause problems including severe resist loss, poor wafer planarization, and, in extreme cases, metal shorts at narrow gap regions.

Workers in the art have sought to avoid or reduce the problems of microloading. U.S. Pat. No. 5,582,679 to Lian-jun et al teaches higher temperature etching to reduce microloading effects and teaches the use of $N_2$ to form a protective polymer during etching. U.S. Pat. No. 5,556,501 to Collins et al teaches a method of etching with selectivity. U.S. Pat. No. 5,545,289 to Chen et al teaches removing etchant byproducts using a multi-step passivation and stripping process.

SUMMARY OF THE INVENTION

A principal object of the present invention is to provide an effective and very manufacturable method of etching metal lines.

Another object of the present invention is to provide a method of etching metal lines with reduced microloading effect.

A further object of the present invention is to provide a method of etching metal lines with reduced microloading effect by introducing a selective etch step.

In accordance with the objects of this invention a new method of etching metal lines with reduced microloading effect is achieved. Semiconductor device structures are provided in and on a semiconductor substrate. The semiconductor device structures are covered with an insulating layer. A barrier metal layer is deposited overlying the insulating layer and a metal layer is deposited overlying the barrier metal layer. The metal layer is covered with a layer of photoresist. The photoresist layer is exposed to actinic light and developed and patterned to form the desired photoresist mask wherein there are both wide spaces and narrow spaces between portions of the photoresist mask. The metal layer is etched away where it is not covered by the photoresist mask wherein the barrier metal layer is reached within the wide spaces while some of the metal layer remains within the narrow spaces. The metal layer remaining within the narrow spaces is selectively etched away. Thereafter, the barrier metal layer not covered by the photoresist mask is etched away wherein the insulating layer is reached within the wide spaces while some of the barrier metal layer remains within the narrow spaces. The barrier metal layer remaining within the narrow spaces is selectively etched away. Thereafter, the insulating layer not covered by the photoresist mask is overetched to complete the metal lines without microloading to in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
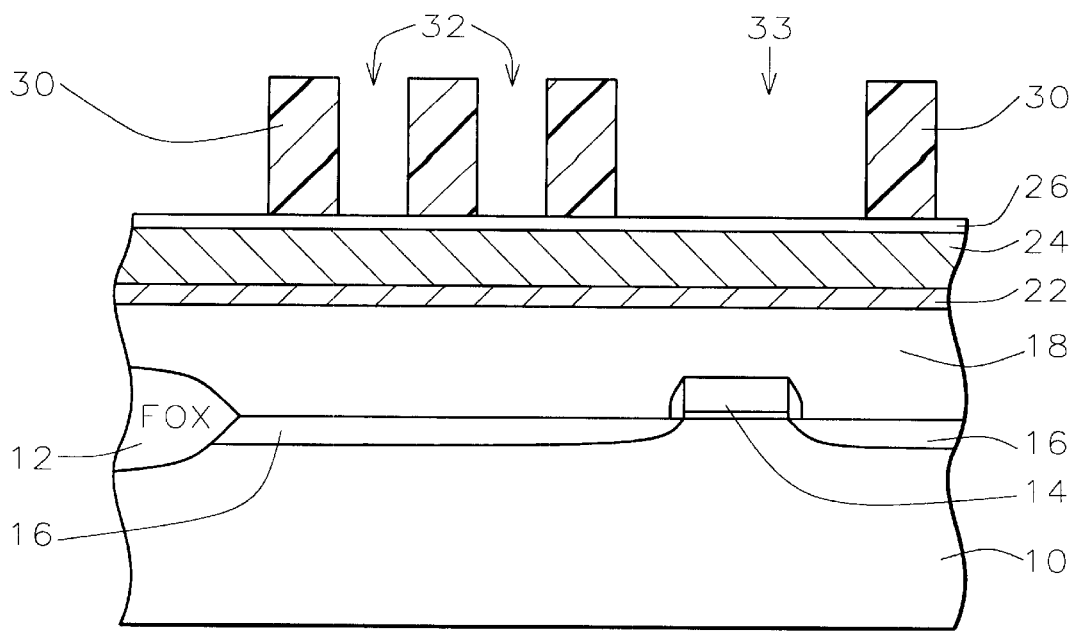
FIGS. 1 through 6 schematically illustrate in cross-sectional representation a preferred embodiment of the present invention.

Referring now more particularly to FIG. 1, there is illustrated a portion of a partially completed integrated circuit. Semiconductor substrate 10 is preferably composed of monocrystalline silicon. Field oxide regions 12 have been formed as is conventional in the art in the semiconductor substrate 10. Semiconductor device structures, including gate electrode 14 and source and drain regions 16, are fabricated in and on the semiconductor substrate. A thick insulating layer 18 of silicon dioxide or a composite of silicon dioxide and spin-on-glass, or the like, is blanket deposited over the semiconductor device structures.

Next, a barrier layer 22 is deposited over the insulating layer. This may be titanium, titanium nitride, titanium tungsten, or the like, or a combination of more than one material such as titanium nitride overlying titanium, with a thickness of between about 100 and 2500 Angstroms. For example, a barrier metal layer of titanium may preferably have a thickness of 100 to 1000 Angstroms, a layer of titanium nitride may have a thickness of 200 to 1200 Angstroms, a layer of titanium tungsten may have a thickness of 200 to 1000 Angstroms, and a combination layer may have a thickness of 300 to 2500 Angstroms.

The metal layer 24 is deposited over the barrier layer 22. The metal layer comprises aluminum or an alloy such as aluminum-copper or aluminum-copper-silicon and is deposited by sputtering or chemical vapor deposition (CVD) to a thickness of between about 3500 and 10,000 Angstroms. An antireflective coating (ARC) layer 26 of titanium nitride may be deposited overlying the metal layer.

A layer of photoresist is coated over the ARC layer 26 and is exposed and developed to form the photoresist mask 30. There are both narrow spaces 32 and wide spaces 33 to be etched. The narrow spaces are less than about 0.6 microns in width.

Figure 2:
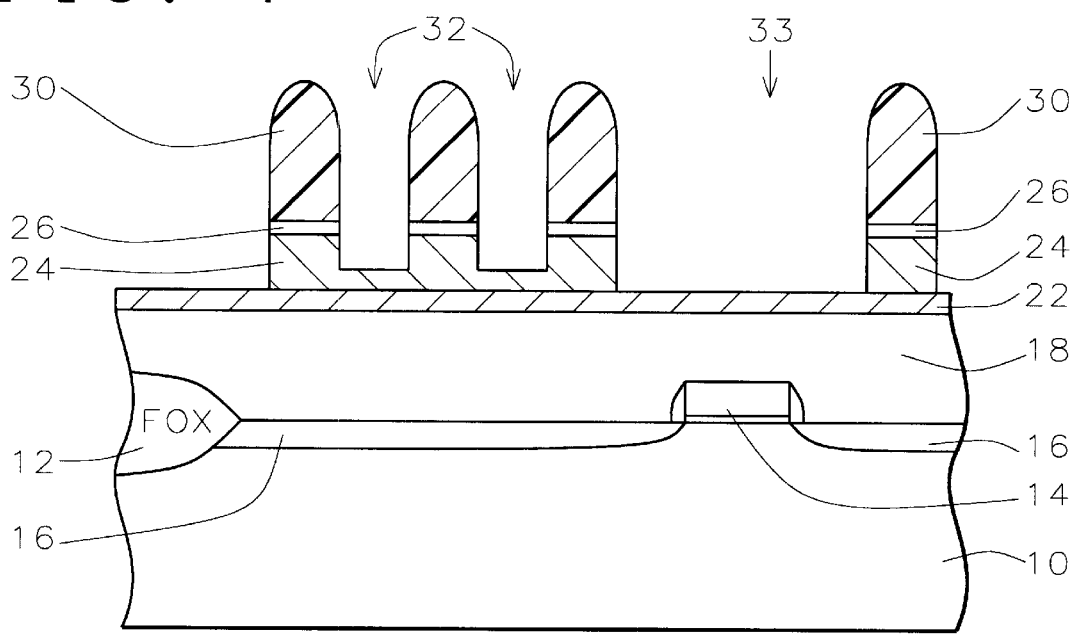

Referring now to FIG. 2, the antireflective coating layer 26 and the metal layer 24 is etched away where it is not covered by the mask 30 until the end point of the etch is reached; that is, the barrier layer 22. It can be seen that the metal etch end point is reached in the wide spaces 33 while in the narrow spaces 32, some of the metal layer still remains. This is the microloading effect.

If the unetched metal remains within the narrow spaces, it will block the barrier metal etch there causing more microloading. Eventually, this metal remaining may cause shorting in small geometries.

Figure 3:
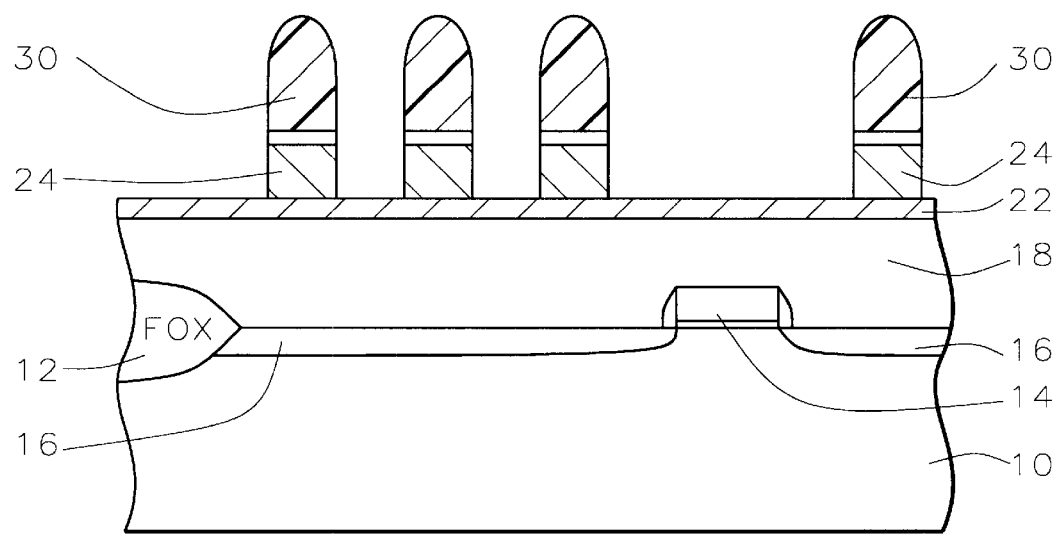

The key feature of the present invention will now be described. A selective etch step is introduced after the metal etching is complete to etch the metal layer 24 selective to the barrier metal layer 22. In this way, all the metal in the narrow spaces 32 is etched away without etching of the barrier metal layer, as illustrated in FIG. 3. The etching recipe must be modified in order to achieve the desired selectivity for etching the metal while not etching the barrier metal layer. The recipe contents depend upon the chamber configuration which is different for different machines. Since this selective etch is used only to etch away the small amount of metal remaining in the narrow spaces, the selective etch need not be selective to photoresist nor have a fast etch rate or good etching profile.

Figure 4:
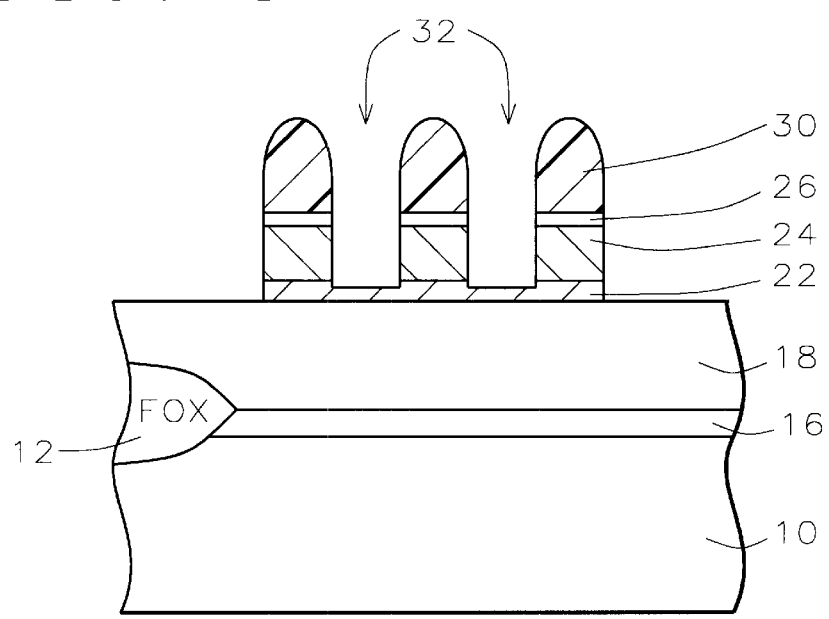

FIG. 4 illustrates a close-up view of the narrow spaces 32. After the selective etch is performed to remove the remaining metal layer, a standard barrier layer etch is performed. As before, the microloading effect causes the narrow spaces to etch more slowly than the wider spaces. The barrier layer is etched completely through in the wider areas 33 while some of the barrier layer remains within the narrow spaces 32.

Figure 5:
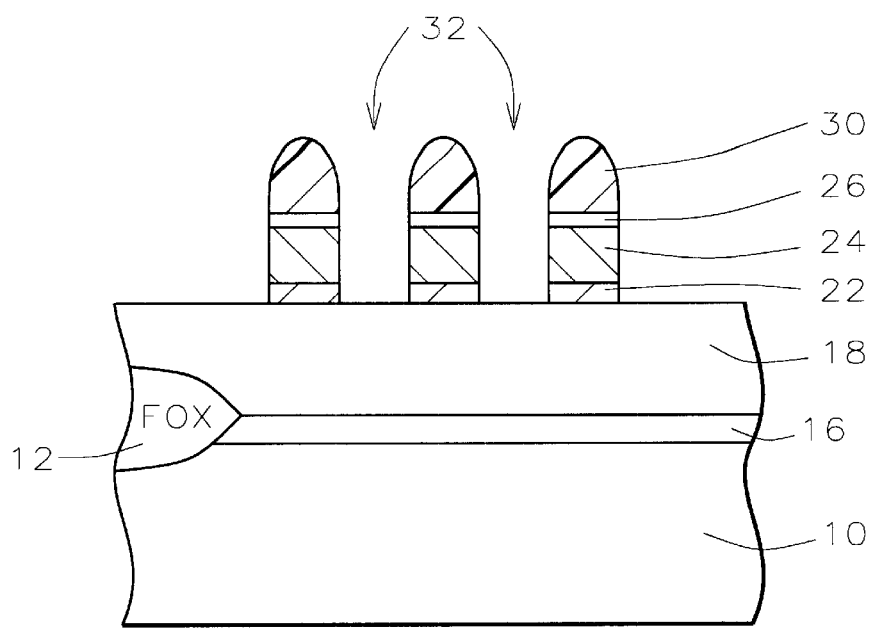

Another selective etch is performed, selective for the barrier layer with respect to the underlying insulating layer. This selective etch removes the barrier layer remaining within the narrow spaces 32, as shown in FIG. 5. As with the selective metal etch, this etch recipe must be modified to be selective to the barrier layer with respect to the insulating layer. If the barrier layer is a dual layer, it is possible to separate and make the etch selective to each layer, or to use a single etch step selective to both barrier layers with respect to the insulating layer.

Figure 6:
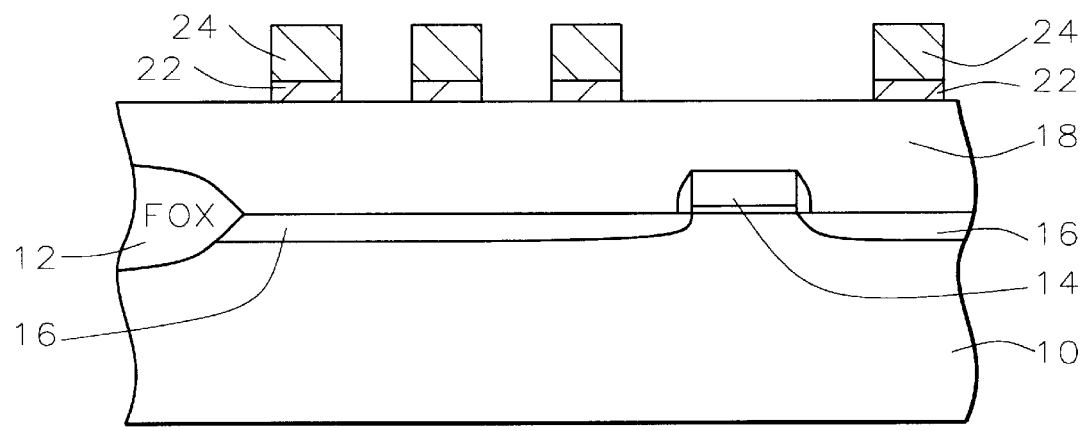

Finally, a standard oxide overetch is performed to remove residual metal stringers, etc. FIG. 6 illustrates the completed metal lines of the present invention.

The process of the present invention provides an effective method for forming metal lines with reduced microloading effect. A selective etch is added after the metal etch and after the barrier metal etch to remove the metal remaining due to the microloading effect. This results in metal lines without poor planarization or shorting.

While the invention has been particularly shown and described with reference to the preferred embodiments thereof, it will be understood by those skilled in the art that various changes in form and details may be made without departing from the spirit and scope of the invention.

What is claimed is:

1. A method of forming metal lines without microloading in the fabrication of an integrated circuit comprising:

providing semiconductor device structures in and on a semiconductor substrate;

covering said semiconductor device structures with an insulating layer;

depositing a barrier metal layer overlying said insulating layer;

depositing a metal layer overlying said barrier metal layer;

covering said metal layer with a layer of photoresist;

exposing said photoresist layer to actinic light and developing and patterning said photoresist layer to form the desired photoresist mask wherein there are both wide spaces and narrow spaces between portions of said photoresist mask;

etching away said metal layer not covered by said photoresist mask wherein said barrier metal layer is reached within said wide spaces while some of said metal layer remains within said narrow spaces;

selectively etching away all of said metal layer remaining within said narrow spaces;

thereafter etching away said barrier metal layer not covered by said photoresist mask wherein said insulating layer is reached within said wide spaces while some of said barrier metal layer remains within said narrow spaces;

selectively etching away all of said barrier metal layer remaining within said narrow spaces; and thereafter overetching said insulating layer not covered by said photoresist mask to complete said metal lines without microloading in said fabrication of said integrated circuit.

2. The method according to claim 1 wherein said semiconductor device structures include gate electrodes and source and drain regions.

3. The method according to claim 1 wherein said barrier metal layer comprises titanium with a thickness of between about 100 and 1000 Angstroms.

4. The method according to claim 1 wherein said barrier metal layer comprises titanium nitride with a thickness of between about 200 and 1200 Angstroms.

5. The method according to claim 1 wherein said barrier metal layer comprises titanium tungsten with a thickness of between about 200 and 1000 Angstroms.

6. The method according to claim 1 wherein said barrier metal layer comprises titanium and titanium nitride with a combined thickness of between about 300 and 2500 Angstroms.

7. The method according to claim 1 wherein said metal layer comprises aluminum having a thickness of between about 3500 and 10,000 Angstroms.

8. The method according to claim 1 wherein said metal layer comprises aluminum-copper having a thickness of between about 3500 and 10,000 Angstroms.

9. The method according to claim 1 further comprising depositing an antireflective coating layer overlying said metal layer.

10. The method according to claim 1 wherein said narrow spaces are less than about 0.6 microns in width.

11. The method according to claim 1 wherein said selectively etching of said metal layer comprises etching said metal layer remaining with an etch recipe that is selective to said metal layer with respect to said barrier metal layer.

12. The method according to claim 1 wherein said selectively etching of said barrier metal layer comprises etching said barrier metal layer remaining with an etch recipe that is selective to said barrier metal layer with respect to said insulating layer.

13. A method of forming metal lines without microloading in the fabrication of an integrated circuit comprising:

providing semiconductor device structures in and on a semiconductor substrate;

covering said semiconductor device structures with an insulating layer;

depositing a barrier metal layer overlying said insulating layer;

depositing a metal layer overlying said barrier metal layer;

depositing an anti-reflective coating layer overlying said metal layer;

covering said anti-reflective coating layer with a layer of photoresist;

exposing said photoresist layer to actinic light and developing and patterning said photoresist layer to form the desired photoresist mask wherein there are both wide spaces and narrow spaces between portions of said photoresist mask and wherein said narrow spaces are less than about 0.6 microns in width;

etching away said antireflective coating layer and said metal layer not covered by said photoresist mask wherein said barrier metal layer is reached within said wide spaces while some of said metal layer remains within said narrow spaces;

selectively etching away all of said metal layer remaining within said narrow spaces;

thereafter etching away said barrier metal layer not covered by said photoresist mask wherein said insulating layer is reached within said wide spaces while some of said barrier metal layer remains within said narrow spaces;

selectively etching away all of said barrier metal layer remaining within said narrow spaces; and thereafter overetching said insulating layer not covered by said photoresist mask to form said metal lines without microloading to complete said fabrication of said integrated circuit.

14. The method according to claim 13 wherein said semiconductor device structures include gate electrodes and source and drain regions.

15. The method according to claim 13 wherein said barrier metal layer comprises one of the group containing titanium, titanium nitride, titanium tungsten, and titanium/titanium nitride.

16. The method according to claim 13 wherein said barrier metal layer has a thickness of between about 100 and 2500 Angstroms.

17. The method according to claim 13 wherein said metal layer comprises aluminum having a thickness of between about 3500 and 10,000 Angstroms.

18. The method according to claim 13 wherein said selectively etching of said metal layer comprises etching said metal layer remaining with an etch recipe that is selective to said metal layer with respect to said barrier metal layer.

19. The method according to claim 13 wherein said selectively etching of said barrier metal layer comprises etching said barrier metal layer remaining with an etch recipe that is selective to said barrier metal layer with respect to said insulating layer.

20. A method of forming metal lines without microloading in the fabrication of an integrated circuit comprising:

providing semiconductor device structures in and on a semiconductor substrate;

covering said semiconductor device structures with an insulating layer;

depositing a barrier metal layer overlying said insulating layer;

depositing a metal layer overlying said barrier metal layer;

depositing an anti-reflective coating layer overlying said metal layer;

covering said anti-reflective coating layer with a layer of photoresist;

exposing said photoresist layer to actinic light and developing and patterning said photoresist layer to form the desired photoresist mask wherein there are both wide spaces and narrow spaces between portions of said photoresist mask and wherein said narrow spaces are less than about 0.6 microns in width;

etching away said antireflective coating layer and said metal layer not covered by said photoresist mask wherein said barrier metal layer is reached within said wide spaces while some of said metal layer remains within said narrow spaces;

selectively etching away all of said metal layer remaining within said narrow spaces using an etch recipe that is selective to said metal layer with respect to said barrier metal layer;

thereafter etching away said barrier metal layer not covered by said photoresist mask wherein said insulating layer is reached within said wide spaces while some of all of said barrier metal layer remains within said narrow spaces;

selectively etching away said barrier metal layer remaining within said narrow spaces using an etch recipe that is selective to said barrier metal layer with respect to said insulating layer; and thereafter overetching said insulating layer not covered by said photoresist mask to form said metal lines without microloading to complete said fabrication of said integrated circuit.

* * * * *